United States Patent
Huang

(10) Patent No.: US 11,923,274 B2
(45) Date of Patent: *Mar. 5, 2024

(54) SEMICONDUCTOR DEVICE PACKAGE INCLUDING PROMOTERS AND METHOD OF MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/071,595

(22) Filed: Nov. 29, 2022

(65) Prior Publication Data

US 2023/0088723 A1    Mar. 23, 2023

Related U.S. Application Data

(63) Continuation of application No. 17/111,335, filed on Dec. 3, 2020, now Pat. No. 11,515,234.

(51) Int. Cl.
*H01L 23/48* (2006.01)
*H01L 23/00* (2006.01)
*H01L 23/66* (2006.01)

(52) U.S. Cl.
CPC .......... *H01L 23/481* (2013.01); *H01L 23/66* (2013.01); *H01L 24/05* (2013.01); *H01L 24/89* (2013.01)

(58) Field of Classification Search
CPC ....... H01L 23/481; H01L 23/66; H01L 24/05; H01L 24/89
See application file for complete search history.

(56) References Cited

U.S. PATENT DOCUMENTS

| | | | | |
|---|---|---|---|---|
| 9,257,399 | B2 * | 2/2016 | Kuang | H01L 23/5385 |
| 9,536,920 | B2 * | 1/2017 | Chen | H01L 27/14636 |
| 11,011,494 | B2 * | 5/2021 | Gao | H01L 24/08 |
| 11,063,012 | B1 * | 7/2021 | Shih | H01L 23/481 |
| 11,232,998 | B2 * | 1/2022 | Jhong | H01L 23/5283 |
| 2007/0099111 | A1 * | 5/2007 | Naiini | G03F 7/0392 |
| | | | | 430/270.1 |
| 2008/0194095 | A1 * | 8/2008 | Daubenspeck | H01L 23/3192 |
| | | | | 438/612 |
| 2009/0200072 | A1 | 8/2009 | Yamasaki | |

(Continued)

FOREIGN PATENT DOCUMENTS

CN         201910415 U    *  7/2011

OTHER PUBLICATIONS

Non-Final Office Action for U.S. Appl. No. 17/111,335, dated Feb. 17, 2022, 9 pages.

(Continued)

*Primary Examiner* — Mamadou L Diallo
(74) *Attorney, Agent, or Firm* — FOLEY & LARDNER LLP

(57) ABSTRACT

The subject application discloses a substrate. The substrate includes a first conductive layer, a first bonding layer, a first dielectric layer, and a conductive via. The first bonding layer is disposed on the first conductive layer. The first dielectric layer is disposed on the first bonding layer. The conductive via penetrates the first dielectric layer and is electrically connected with the first conductive layer.

15 Claims, 8 Drawing Sheets

1C

(56) References Cited

U.S. PATENT DOCUMENTS

| | | | |
|---|---|---|---|
| 2013/0256893 A1* | 10/2013 | Tsai | H01L 24/05 |
| | | | 257/E21.59 |
| 2016/0343666 A1* | 11/2016 | Deshpande | H01L 23/5383 |
| 2016/0365332 A1* | 12/2016 | Kalnitsky | H01L 24/73 |
| 2017/0170107 A1* | 6/2017 | Paek | H01L 23/49816 |
| 2017/0294394 A1* | 10/2017 | Suzuki | B32B 15/04 |
| 2017/0294408 A1* | 10/2017 | Happoya | H01L 23/3128 |
| 2019/0115294 A1* | 4/2019 | Lu | H01L 23/49866 |
| 2019/0164917 A1* | 5/2019 | Huang | H01L 23/3192 |
| 2019/0198972 A1* | 6/2019 | Chen | H01Q 1/36 |
| 2019/0198973 A1* | 6/2019 | Chen | H01L 23/53257 |
| 2019/0371621 A1* | 12/2019 | Darmawikarta | H01L 23/49822 |
| 2020/0273794 A1* | 8/2020 | Khaderbad | H01L 29/785 |
| 2021/0057363 A1* | 2/2021 | Chen | H01L 21/187 |
| 2021/0066222 A1* | 3/2021 | Chen | H01L 24/08 |
| 2021/0159201 A1* | 5/2021 | Yu | H01L 24/20 |
| 2021/0257292 A1* | 8/2021 | Shih | H01L 21/76877 |
| 2021/0265290 A1* | 8/2021 | Liu | H01L 23/49503 |
| 2022/0035204 A1* | 2/2022 | He | G02F 1/133603 |
| 2022/0037256 A1* | 2/2022 | Shih | H01L 21/76877 |

OTHER PUBLICATIONS

Notice of Allowance for U.S. Appl. No. 17/111,335, dated Jul. 27, 2022, 7 pages.

* cited by examiner

SEMICONDUCTOR DEVICE PACKAGE INCLUDING PROMOTERS AND METHOD OF MANUFACTURING THE SAME

CROSS-REFERENCE TO RELATED APPLICATIONS

This application is a continuation of U.S. patent application Ser. No. 17/111,335 filed Dec. 3, 2020, now issued as U.S. Pat. No. 11,515,234, the contents of which is incorporated herein by reference in its entirety.

BACKGROUND

1. Technical Field

The present disclosure relates to a semiconductor device package and a method of manufacturing the same, and more particularly to a semiconductor device package including a promoter and a method of manufacturing the same.

2. Description of the Related Art

Wireless communication devices, such as cell phones, typically include antennas for transmitting and receiving radio frequency (RF) signals. In recent years, with the continuous development of mobile communication and the pressing demand for high data rate and stable communication quality, relatively high frequency wireless transmission (e.g., 28 GHz or 60 GHz) has become one of the most important topics in the mobile communication industry. As the frequency of signals increases, the signals are mainly transmitted at or near the surface of conductors (e.g., skin effect). Using thicker conductors for signal transmission may increase an insertion loss of the signals. Hence, it is desirable to reduce the insertion loss of the transmitted signals.

SUMMARY

In accordance with some embodiments of the present disclosure, a substrate includes a first conductive layer, a first bonding layer, a first dielectric layer, and a conductive via. The first bonding layer is disposed on the first conductive layer. The first dielectric layer is disposed on the first bonding layer. The conductive via penetrates the first dielectric layer and is electrically connected with the first conductive layer.

In accordance with some embodiments of the present disclosure, a substrate includes a conductive layer, a bonding layer, and a dielectric layer. The conductive layer has a thickness less than 12 micrometers. The bonding layer is disposed on the first conductive layer. The dielectric layer is disposed on the promoter. A bonding force between the conductive layer and the dielectric layer is higher than 5.8N.

In accordance with some embodiments of the present disclosure, a method of manufacturing a substrate includes bonding a bonding layer directly on a conductive layer; and bonding a dielectric layer directly on the bonding layer.

Figure 1A:
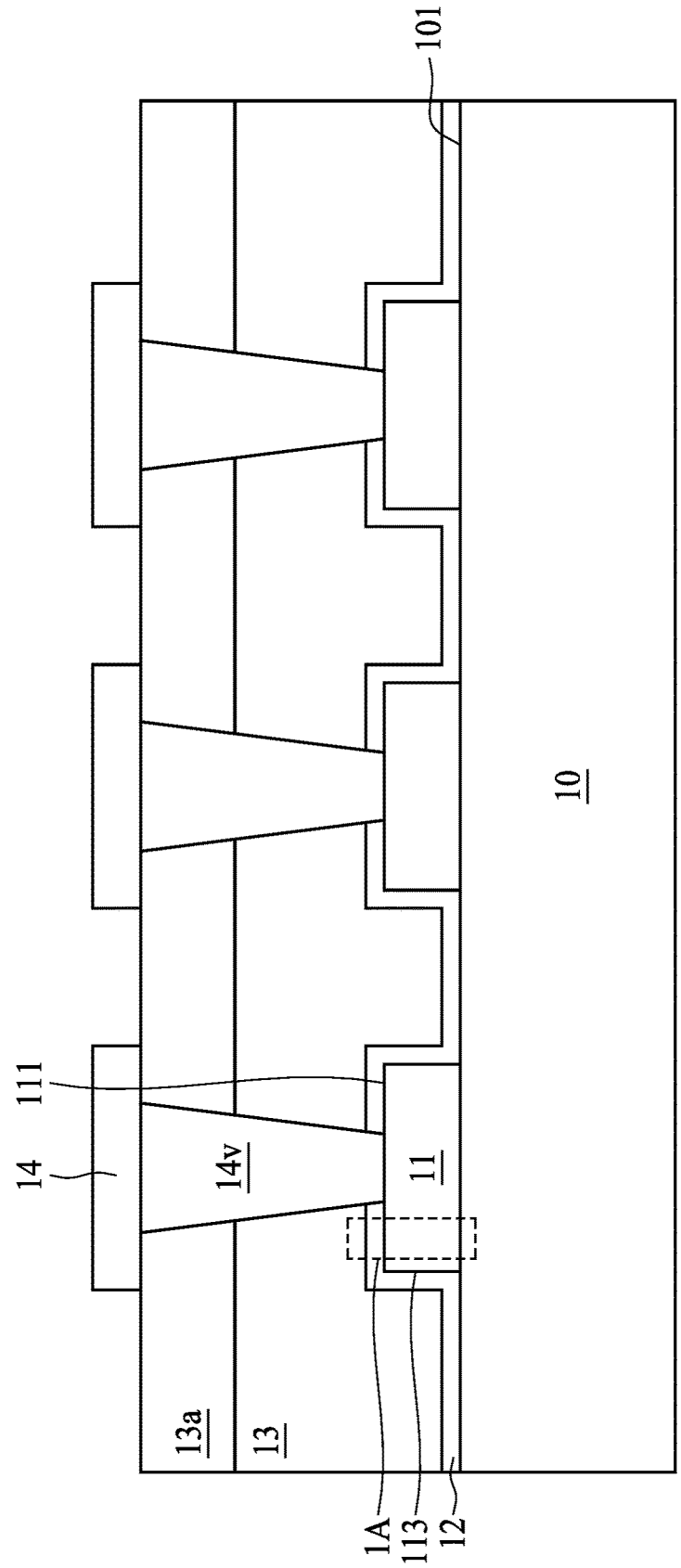
FIG. 1A illustrates a cross-sectional view of a semiconductor device package, in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

Figure 1B:
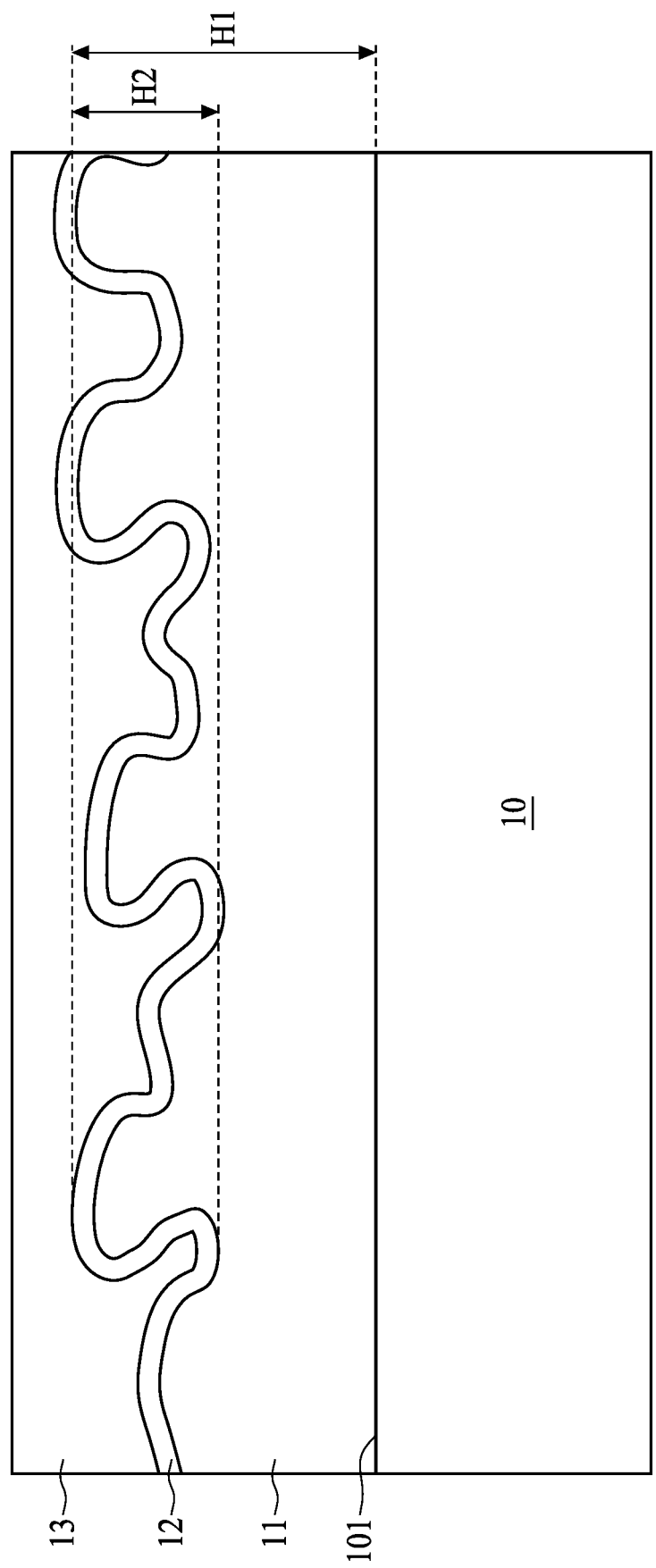
FIG. 1B illustrates an enlarged view of a portion of the semiconductor device package as shown in FIG. 1A, in accordance with some embodiments of the present disclosure.

FIG. 1A illustrates a cross-sectional view of a semiconductor device package 1 (or a portion of the semiconductor device package), in accordance with some embodiments of the present disclosure. FIG. 1B illustrates an enlarged view of a portion of the semiconductor device package 1 encircled by a dotted-line box 1A, in accordance with some embodiments of the present disclosure. The semiconductor device package 1 includes a substrate 10, electrical contacts 11, a promoter 12, dielectric layers 13, 13a, a conductive layer 14, and conductive vias 14v. In some embodiments, the semiconductor device package 1 may further include one or more electronic components and/or antennas (not shown) disposed on the conductive layer 14 and electrically connected to the substrate 10 through the conductive vias 14v and the electrical contacts 11. In some embodiments, the structure as shown in FIG. 1A may be referred to as a substrate.

The substrate 10 (or carrier) may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the substrate 10 may be a single-layer substrate or multi-layer substrate. In some embodiments, the substrate 10 may include a glass substrate.

The electrical contacts 11 (e.g., conductive pads, a conductive layer, or a metal layer) are disposed on a surface 101 of the substrate 10. The electrical contacts 11 may be spaced apart from each other. In some embodiments, as shown in FIG. 1B, the thickness H1 (e.g., a distance between the upmost portion of the electrical contact 11 and the surface 101 of the substrate 10) of the electrical contact 11 is less than 12 micrometers (μm). For example, the thickness H1 of the electrical contact 11 is less than 3 μm. For example, the thickness H1 of the electrical contact 11 is in a range from 2 μm to 3 μm. In some embodiments, a maximum height H2 of a root (e.g., a distance between the upmost portion of the electrical contact 11 and the bottommost portion of the electrical contact 11) of the electrical contact 11 is less than 2 μm. For example, the maximum height H2 of the root of the electrical contacts 11 is less than 1 μm. For example, the maximum height H2 of the root of the electrical contacts 11 is in a range from 0.3 µm to 1 µm. In accordance with the embodiments of the present disclosure, the insertion loss of signals transmitted through the electrical contacts 11 can be reduced by using electrical contacts having a relatively thinner thickness and/or a relatively shorter root, which can improve the electrical performance of the semiconductor device package 1.

In some embodiments, the electrical contract 11 may be or include a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

The promoter 12 (e.g., surface-active agent (surfactant) or adhesion promoter) is disposed on the substrate 10 and the electrical contacts 11. The promoter 12 at least partially covers the substrate 10 and the electrical contacts 11. For example, the promoter 12 surrounds the electrical contacts 11. For example, the promoter 12 is in contact with a portion of the surface 101 of the substrate 10 exposed from the electrical contacts 11. For example, the promoter 12 is in contact with a lateral surface 113 and a portion of a top surface 111 of each of the electrical contacts 11. A portion of the top surface 111 of each of the electrical contacts 11 is exposed from the promoter 12. In some embodiments, the promoter 12 may include one or more polar compounds. The polar compounds may include moieties or functional groups that can crosslink with a polymeric material or resin. The polar compounds may include moieties or functional groups that can crosslink with metal ions/atoms. The polar compounds may include one or more moieties or functional groups including an amino group, a hydroxyl group, a triazole group, or a combination thereof. The polar compound may include amine, methanol, 3-amino-1,2,4-triazole, or a combination thereof. In some embodiments, a thickness of the promoter 12 is in a range from about 50 Ångstrom(Å) to about 100 Å. In some embodiments, the promoter 12 may be referred to as a bonding layer or an adhesive layer.

The dielectric layer 13 (which can be referred to as a non-metal layer) is disposed on the substrate 10, the electrical contacts 11, and the promoter 12. The dielectric layer 13 is in contact with the promoter 12. The dielectric layer 13 is spaced apart from the electrical contacts 11 through the promoter 12. The dielectric layer 13 is spaced apart from the substrate 10 through the promoter 12. The dielectric layer 13 may include, but is not limited to, molding compounds or pre-impregnated composite fibers (e.g., pre-preg). Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The dielectric layer 13a (which can be referred to as a non-metal layer) is disposed on the dielectric layer 13. The dielectric layer 13a and the dielectric layer 13 may include the same material. Alternatively, the dielectric layer 13a and the dielectric layer 13 may include different materials. In some embodiments, there may be N dielectric layers disposed on the substrate 10 depending on design requirements, where N is an integer equal to or greater than 1.

In some embodiments, chemical links (e.g., cross-links) or chemical bonds are formed between the promoter 12 and each of the electrical contacts 11 by chemical reactions (e.g., cross-link reactions). In some embodiments, chemical links (e.g., cross-links) or chemical bonds are formed between the promoter 12 and the dielectric layer 13 by chemical reactions (e.g., cross-link reactions). In some embodiments, the functional groups of the promoter 12 may crosslink with the dielectric layer 13 (e.g., the polymeric material or resin of the dielectric layer 13) so as to form chemical bonds between the promoter 12 and the dielectric layer 13. For example, the moieties of functional groups (e.g., a triazole group of the like) of the promoter 12 may form crosslinked polymers with the dielectric layer 13 so as to form a strong crosslinked structure between the promoter 12 and the dielectric layer 13. In some embodiments, the functional groups of the promoter 12 may crosslink with the electrical contacts 11 (e.g., the metal ions/atoms of the dielectric layer 13) so as to form chemical bonds between the promoter 12 and the electrical contacts 11. For example, the moieties of functional groups (e.g., an amino group of the like) of the promoter 12 may serve as a chelating surfactant to coordinate with the metal ions of the electrical contacts 11 so as to form strong chemical bonding between the promoter 12 and the electrical contacts 11.

In some embodiments, the promoter 12 may be omitted, and the dielectric layer 13 is in contact with the electrical contacts 11. As mentioned above, to reduce the insertion loss of the signals transmitted through the electrical contacts 11, the electrical contacts 11 may have a relatively thinner thickness or a relatively shorter root (e.g., a distance between the upmost portion of the electrical contact 11 and the bottommost portion of the electrical contacts 11). However, as the thickness or the root of the electrical contacts 11 decreases, the connection or bonding force between the dielectric layer 13 and the electrical contacts 11 would be weakened, which would cause delamination.

In accordance with the embodiments as shown in FIG. 1A and FIG. 1B, the promoter 12 is disposed between the dielectric layer 13 and the electrical contacts 11. Since the promoter 12 may form chemical bonds with both the dielectric layer 13 and the electrical contacts 11, the bonding or connection force between the dielectric layer 13 and the electrical contacts 11 can be enhanced, and the delamination issue can be eliminated. In some embodiments, in the case that the thickness H1 of the electrical contacts 11 is in a range from 2 µm to 3 µm and/or that the maximum height H2 of the root of the electrical contacts 11 is in a range from 0.3 µm to 1 µm, the semiconductor device package 1 can pass MSL2a test. For example, an interface between the dielectric layer 13 and the electrical contacts 11 can sustain or bear a tensile force equal to or greater than 5.8 N, which is more than two times higher than the tensile force that can be sustained between the dielectric layer 13 and the electrical contacts 11 without the promoter 12. For example, a bonding force between the electrical contacts 11 and the dielectric layer 13 is higher than 5.8N.

In some embodiments, the bonding force between the electrical contacts 11 and the dielectric layer 13 can be measured by, for example, peeling test or any other suitable operations. For example, the stacked structure including the electrical contacts 11, the promoter 12, and the dielectric layer 13 can be fastened on a test platform, and then a force (e.g., a tensile force) is applied to the electrical contacts 11 (or the dielectric layer 13) to pull the electrical contacts 11 (or the dielectric layer 13). The maximum force that can separate the electrical contacts 11 (or the dielectric layer 13) from the promoter 12 can be defined as the bonding force between the electrical contacts 11 and the dielectric layer 13.

The conductive layer 14 is disposed on the dielectric layer 13a. The conductive vias 14v penetrate the dielectric layer 13a, the dielectric layer 13, and the promoter 12 and electrically connect the conductive layer 14 with the electrical contacts 11. The conductive vias 14v are in contact with the corresponding electrical contacts 11. A lateral surface of each of the conductive vias 14v is surrounded by the dielectric layer 13a. The lateral surface of each of the conductive vias 14v is surrounded by the dielectric layer 13. The lateral surface of each of the conductive vias 14v is surrounded by the promoter 12. The lateral surface of each of the conductive vias 14v has a first portion in contact with the dielectric layer 13a, a second portion in contact with the dielectric layer 13, and a third portion in contact with the promoter 12. In some embodiments, the conductive layer 14 and the conductive via 14v may be or include a conductive material such as a metal or metal alloy. Examples of the conductive material include Au, Ag, Cu, Pt, Pd, other metal(s) or alloy(s), or a combination of two or more thereof.

Figure 1C:
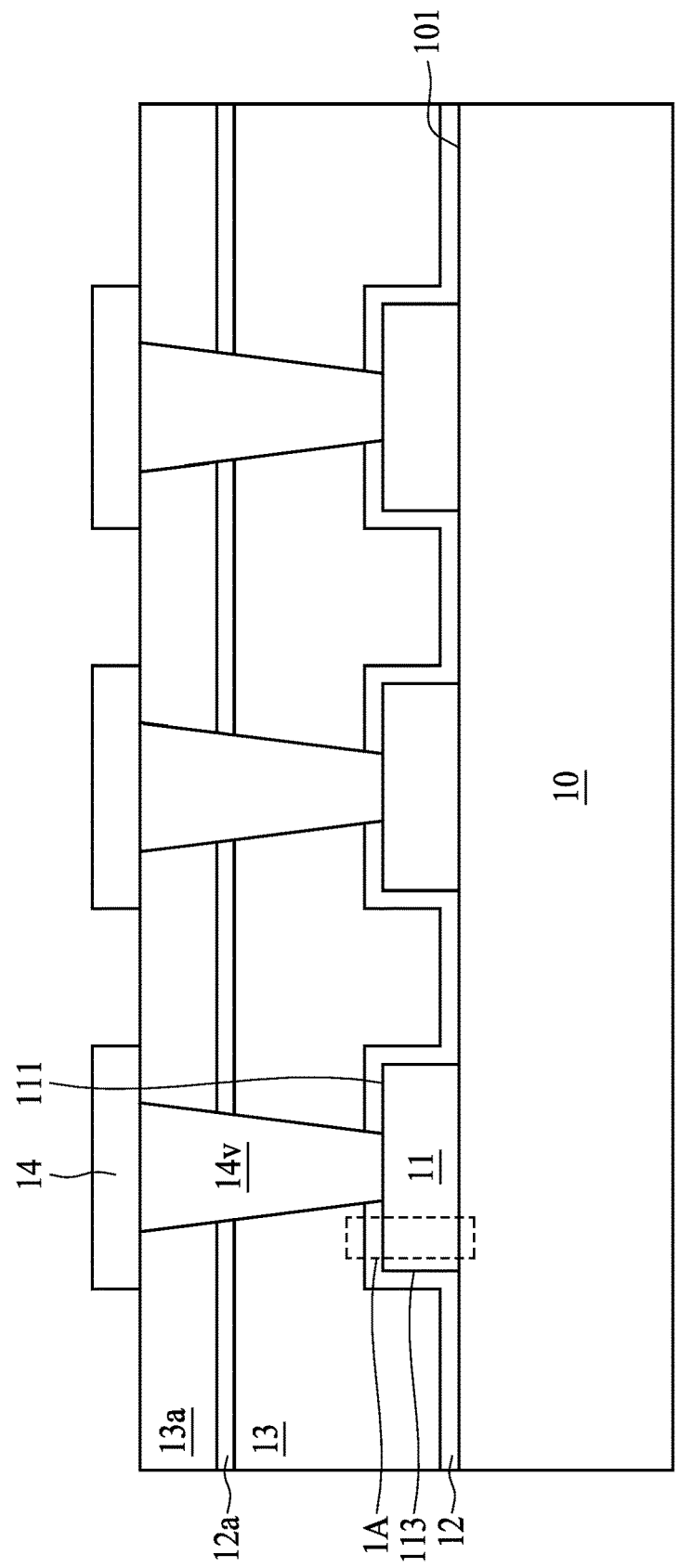
FIG. 1C illustrates a cross-sectional view of a semiconductor device package, in accordance with some embodiments of the present disclosure.

FIG. 1C illustrates a cross-sectional view of a semiconductor device package 1C (or a portion of the semiconductor device package), in accordance with some embodiments of the present disclosure. The semiconductor device package 1C is similar to the semiconductor device package 1, except that the semiconductor device package 1C further includes a promoter 12a disposed between the dielectric layer 13 and the dielectric layer 13a to enhance the connection or bonding force between the dielectric layer 13 and the dielectric layer 13a. The promoter 12a is the same or similar to the promoter 12, and the descriptions for the promoter 12a can be applicable to the promoter 12.

Figure 1D:
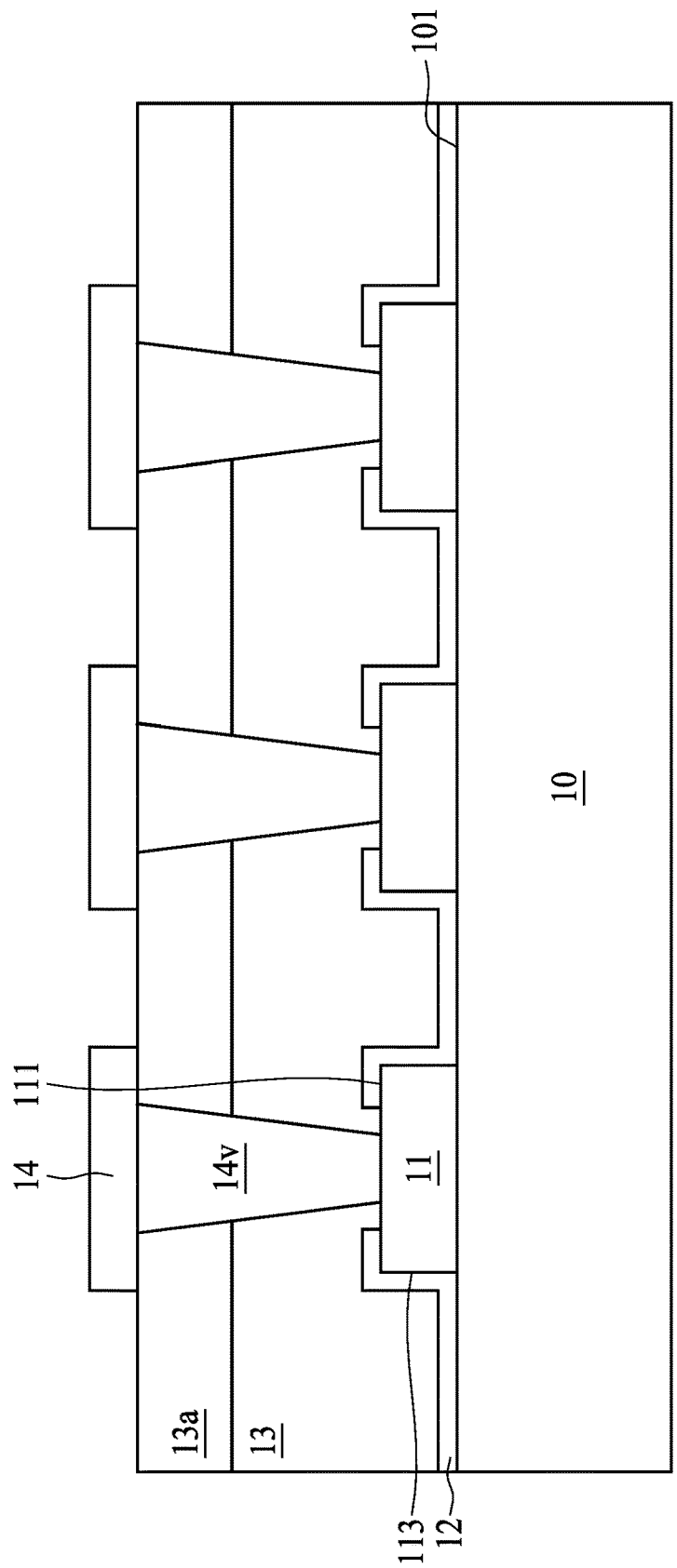
FIG. 1D illustrates a cross-sectional view of a semiconductor device package, in accordance with some embodiments of the present disclosure.

FIG. 1D illustrates a cross-sectional view of a semiconductor device package 1D (or a portion of the semiconductor device package), in accordance with some embodiments of the present disclosure. The semiconductor device package 1D is similar to the semiconductor device package 1, except that the promoter 12 includes one or more openings to expose a portion of the top surface 111 of the electrical contacts 11. The openings may be filled with the dielectric layer 13. The promoter 12 is spaced apart from the conductive vias 14v by the dielectric layer 13. In some embodiments, the promoter 12 may include conductive materials or non-conductive materials.

Figure 1E:
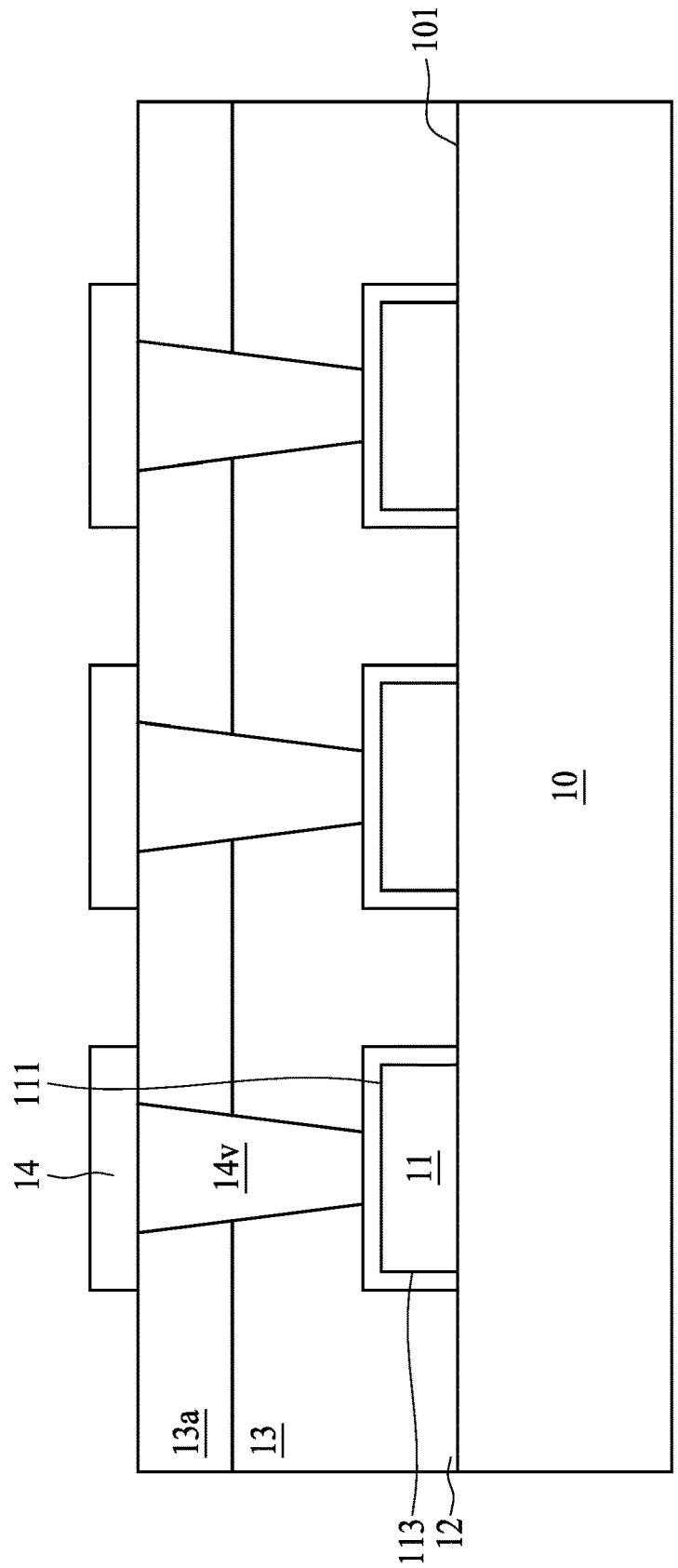
FIG. 1E illustrates a cross-sectional view of a semiconductor device package, in accordance with some embodiments of the present disclosure.

FIG. 1E illustrates a cross-sectional view of a semiconductor device package 1E (or a portion of the semiconductor device package), in accordance with some embodiments of the present disclosure. The semiconductor device package 1E is similar to the semiconductor device package 1, and some of the differences therebetween are described below.

The promoter 12 fully covers the electrical contact 11. For example, the promoter 12 fully covers the top surface 111 and the lateral surfaces 113 of the electrical contact 11. The conductive via 14v is disposed on the promoter 12. The conductive via 14v is spaced apart from the electrical contact 11. The promoter 12 does not extend along the surface 101 of the substrate 10. For example, a portion of the promoter 12 covering one electrical contact is spaced apart from another portion of the promoter 12 covering an adjacent electrical contact. In some embodiments, the promoter 12 may include conductive materials. In other embodiments, the promoter 12 may include one or more openings to expose a portion of the top surface 111 of the electrical contacts 11. In other embodiments, the promoter 12 may expose a portion of the lateral surface 113 of the electrical contact 11.

FIG. 2A, FIG. 2B, FIG. 2C, FIG. 2D, and FIG. 2E illustrate cross-sectional views of a semiconductor manufacturing method, in accordance with some embodiments of the present disclosure. In some embodiments, the method in FIG. 2A, FIG. 2B, FIG. 2C, FIG. 2D, and FIG. 2E can be used to manufacture the semiconductor device package 1 as shown in FIG. 1A.

Figure 2A:
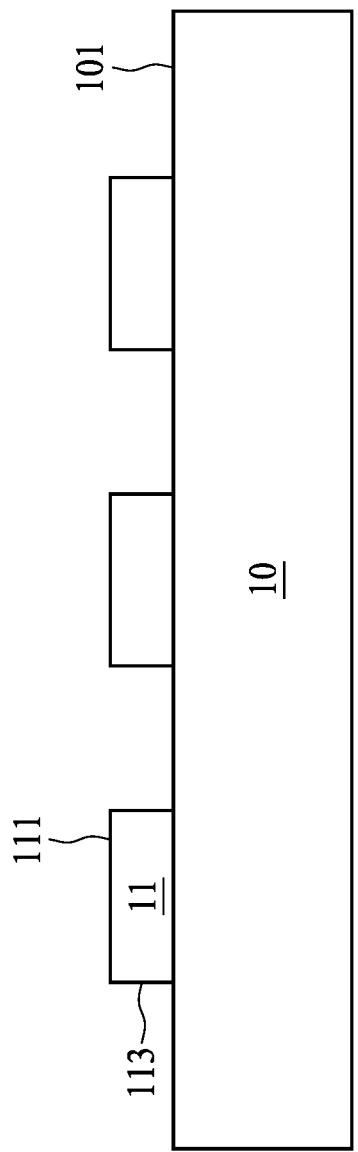
FIG. 2A, FIG. 2B, FIG. 2C, FIG. 2D, and FIG. 2E illustrate cross-sectional views of a semiconductor manufacturing method, in accordance with some embodiments of the present disclosure.

Referring to FIG. 2A, a substrate 10 is provided. Electrical contacts 11 (or conductive layers) are formed on a surface 101 of the substrate 10.

Figure 2B:
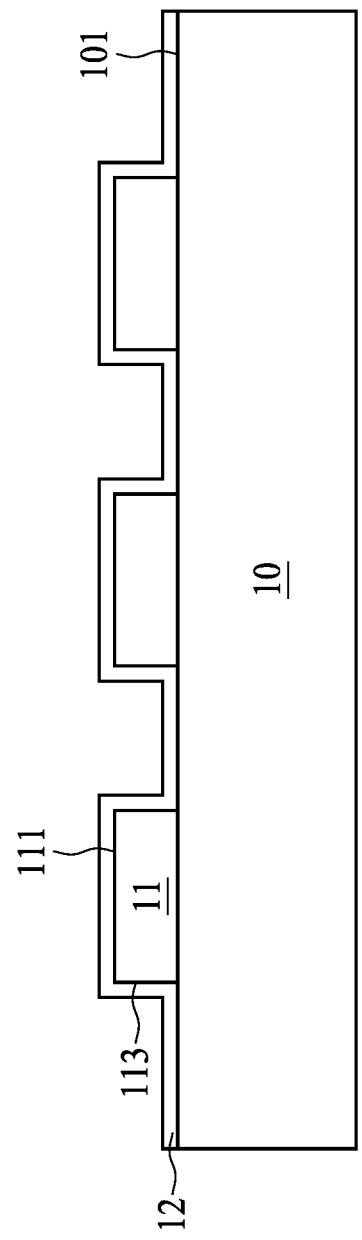

Referring to FIG. 2B, a promoter 12 is formed on the substrate 10 and the electrical contacts 11. In some embodiments, the promoter 12 is in contact with the surface 101 of the substrate 10 and a top surface 111 and lateral surfaces 113 of the electrical contacts 11. The promoter 12 may fully cover the electrical contacts 11. In some embodiments, the promoter 12 may be formed by coating or any other suitable processes. In some embodiments, the electrical contacts 11 may be immersed in a solution with the material of the promoter 12 to form said material on the external surfaces of the electrical contacts 11. Then, a soft bake operation is carried out to the material under a temperature around 100 degrees to volatilize the solvent of the material and to form the promoter 12 via a cross-linking reaction between the material and the electrical contacts 11.

In some embodiments, prior to the formation of the promoter 12, the electrical contacts 11 may be roughened through, for example, etching (e.g., micro-etching) to form the roots on the external surfaces of the electrical contacts 11.

Figure 2C:
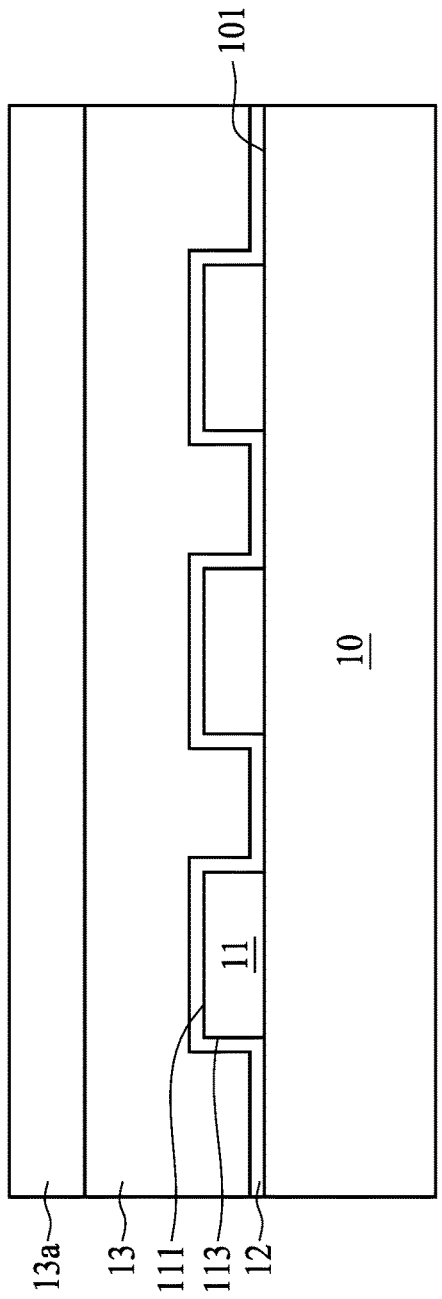

Referring to FIG. 2C, a dielectric layer 13 is formed on the promoter 12. A dielectric layer 13a is formed on the dielectric layer 13. In some embodiments, the dielectric layers 13 and 13a may be formed by lamination or any other suitable operations. In some embodiments, prior to the formation of the dielectric layer 13a, another promoter may be formed on the dielectric layer 13. In some embodiments, after the formation of the dielectric layer 13 on the promoter 12, a soft bake operation is carried out to the dielectric layer 13 and the promoter 12 under a temperature around 100 degrees form a cross-linking between the dielectric layer 13 and the promoter 12. Then, a hard bake operation can be carried out to the dielectric layer 13 under a temperature higher than 200 degrees.

Figure 2D:
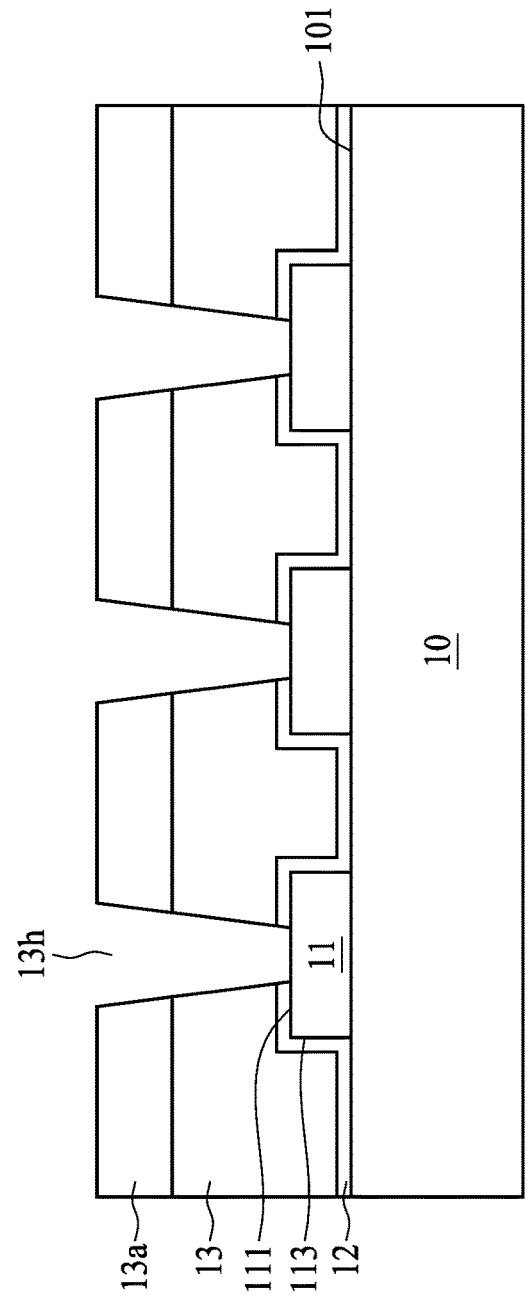

Referring to FIG. 2D, one or more trenches 13h are formed to penetrate the dielectric layers 13a, 13, and the promoter 12 to expose a portion of the top surface 111 of the electrical contacts 11. In some embodiments, the trenches 13h may be formed by, for example, a mechanical drilling, a laser drilling, etching or any other suitable operations.

Figure 2E:
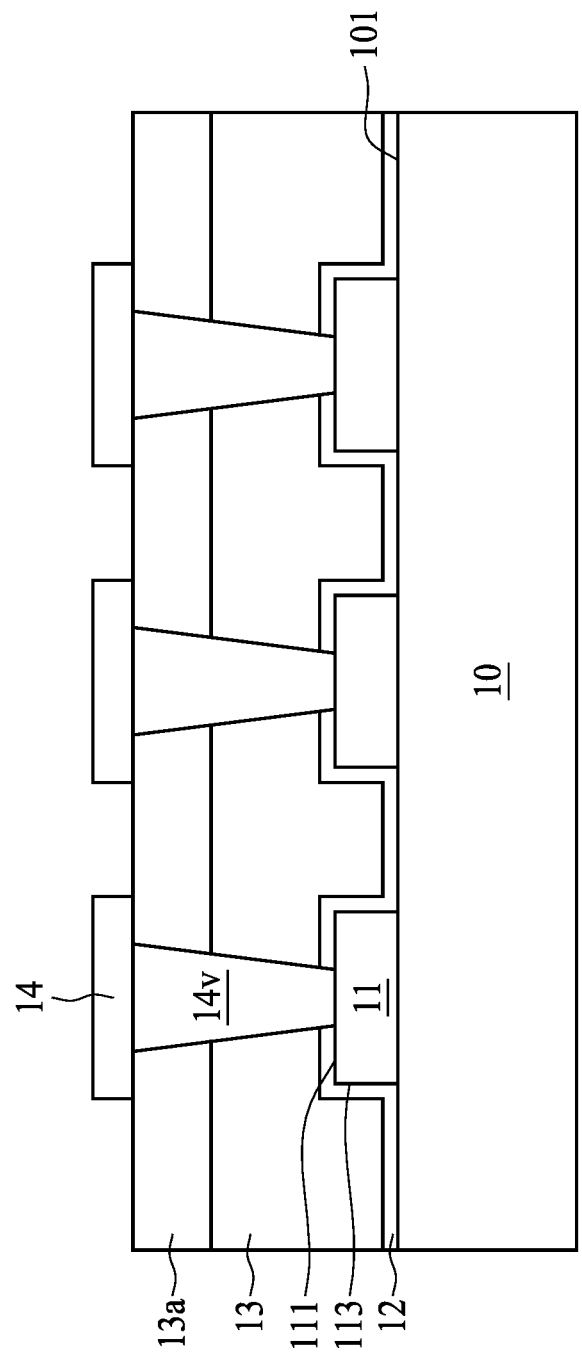

Referring to FIG. 2E, a conductive material is formed on the dielectric layer 13a and within the trenches 13h to form a conductive layer 14 and conductive vias 14v. The conductive vias 14v may be in contact with the dielectric layers 13a, 13, the promoter 12, and the top surface of the electrical contacts 11. In some embodiments, the conductive layer 14 and the conductive vias 14v may be formed by, for example, plating or any other suitable operations.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A substrate, comprising:
   a conductive layer;
   a bonding layer disposed over the conductive layer; and
   a dielectric layer disposed over the bonding layer, wherein a first chemical bond is formed between the conductive layer and the bonding layer, and a second chemical bond is formed between the dielectric layer and the bonding layer,
   wherein a height of a root of the conductive layer is in a range from 0.3 µm to 1 µm.

2. The substrate of claim 1, wherein the bonding layer covers a lateral surface of the conductive layer.

3. The substrate of claim 1, wherein the bonding layer is conformal with a top surface and a lateral surface of the conductive layer.

4. The substrate of claim 1, further comprising a conductive via penetrating the dielectric layer and electrically connected to the conductive layer.

5. The substrate of claim 4, wherein the conductive via penetrates the bonding layer.

6. The substrate of claim 4, wherein the conductive via tapers toward the conductive layer.

7. The substrate of claim 1, wherein a thickness of the conductive layer is equal to or less than 3 micrometers (µm).

8. A substrate, comprising:
   a first conductive layer;
   a first dielectric layer disposed over the first conductive layer;
   a second dielectric layer disposed over the first dielectric layer;
   a first bonding layer disposed between the first dielectric layer and the second dielectric layer; and
   a conductive via penetrating the first bonding layer.

9. The substrate of claim 8, further comprising a second conductive layer disposed over the first dielectric layer.

10. The substrate of claim 8, further comprising a conductive via penetrating the first dielectric layer and electrically connected to the first conductive layer.

11. A substrate, comprising:
    a first conductive layer;
    a first dielectric layer disposed over the first conductive layer;
    a second dielectric layer disposed over the first dielectric layer;
    a first bonding layer disposed between the first dielectric layer and the second dielectric layer; and
    a second bonding layer disposed between the first conductive layer and the first dielectric layer and configured to enhance bonding or connection force between the first dielectric layer and the first conductive layer,
    wherein the second bonding layer surrounds the first conductive layer.

12. A substrate, comprising:
    a first conductive layer;
    a first bonding layer disposed over the first conductive layer;
    a first dielectric layer disposed over the first bonding layer; and
    an antenna disposed over the first conductive layer and electrically connected with the first conductive layer, wherein a lateral surface of the first bonding layer is substantially aligned with a lateral surface of the first dielectric layer.

13. The substrate of claim 12, wherein the first bonding layer is configured to enhance bonding or connection force between the first dielectric layer and the first conductive layer.

14. A substrate, comprising:
a first conductive layer;
a first bonding layer disposed over the first conductive layer;
a first dielectric layer disposed over the first bonding layer;
an antenna disposed over the first conductive layer and electrically connected with the first conductive layer; and
an interconnection structure disposed below the first bonding layer, wherein the first bonding layer includes a first top surface and a second top surface, the second top surface having an elevation different from that of the first top surface with respect to interconnection structure.

15. A substrate, comprising:
a first conductive layer, wherein the first conductive layer includes a first portion and a second portion separated from the first portion;
a first bonding layer disposed over the first conductive layer, wherein a portion of the first bonding layer is disposed between the first portion and the second portion of the first conductive layer;
a first dielectric layer disposed over the first bonding layer;
an antenna disposed over the first conductive layer and electrically connected with the first conductive layer;
a first conductive via penetrating the first dielectric layer and the first bonding layer and electrically connecting the antenna to the first portion of the first conductive layer; and
a second conductive via penetrating the first dielectric layer and the first bonding layer and electrically connected to the second portion of the first conductive layer.

* * * * *